US011709974B2

(12) United States Patent
Huovila et al.

(10) Patent No.: US 11,709,974 B2
(45) Date of Patent: Jul. 25, 2023

(54) MODEL AND TECHNICAL DOCUMENTS (71) Applicant: Trimble Solutions Corporation, Espoo (FI)

(72) Inventors: Mikko Huovila, Espoo (FI); Risto Kunnas, Espoo (FI); Charles Pool, Espoo (FI); David Lash, Espoo (FI); Petri Heinonen, Espoo (FI); Henri Pitkänen, Espoo (FI); Tommi Martela, Espoo (FI)

(73) Assignee: Trimble Solutions Corporation, Espoo (FI)

( * ) Notice: Subject to any disclaimer, the term of this patent is extended or adjusted under 35 U.S.C. 154(b) by 0 days.

(21) Appl. No.: 17/146,055

(22) Filed: Jan. 11, 2021

(65) Prior Publication Data

US 2021/0224430 A1    Jul. 22, 2021

(30) Foreign Application Priority Data

Jan. 17, 2020   (FI) ..................................... 20205053

(51) Int. Cl.
| | |
|---|---|
| *G06F 30/13* | (2020.01) |
| *G06T 15/20* | (2011.01) |
| *G06F 30/12* | (2020.01) |
| *G06F 3/0483* | (2013.01) |
| *G06F 3/04815* | (2022.01) |

(Continued)

(52) U.S. Cl.
CPC .............. *G06F 30/13* (2020.01); *G06F 30/12* (2020.01); *G06T 15/205* (2013.01); *G06F 3/0482* (2013.01); *G06F 3/0483* (2013.01); *G06F 3/04815* (2013.01); *G06F 3/04842* (2013.01); *G06T 2200/24* (2013.01); *G06T 2210/04* (2013.01)

(58) Field of Classification Search
CPC ...... G06F 30/13; G06F 30/12; G06F 3/04815; G06F 3/0482; G06F 3/0483; G06F 3/04842; G06F 3/04845; G06F 30/10; G06F 16/587; G06T 15/205; G06T 2200/24; G06T 2210/04; G06T 19/00; G06T 19/20
See application file for complete search history.

(56) References Cited

U.S. PATENT DOCUMENTS 5,815,154 A * 9/1998 Hirschtick .............. G06T 17/10
                                                          715/835
6,477,438 B1 * 11/2002 Sakai ...................... G06F 30/00
                                                          700/182

(Continued)

OTHER PUBLICATIONS

Finnish Search Report for Application No. 20205053, dated May 14, 2020, 2 pages.

*Primary Examiner* — Matthew Ell
*Assistant Examiner* — Kenny Nguyen
(74) *Attorney, Agent, or Firm* — Kilpatrick Townsend & Stockton LLP (57) ABSTRACT

Document spaces are used for intermediate technical documents created for a model with a displayed 3D model view. A document space is a finite volume having a location in the global three-dimensional coordinate system of the model and a reference to a technical document. A displayed document space in the displayed model view illustrates where one or more model parts, or corresponding pieces of model parts, which are included in the technical document, locate.

18 Claims, 8 Drawing Sheets

(51) Int. Cl.
*G06F 3/0482* (2013.01)
*G06F 3/04842* (2022.01)

(56) References Cited

U.S. PATENT DOCUMENTS

| | | | | |
|---|---|---|---|---|
| 7,913,190 B2* | 3/2011 | Grimaud | | G06T 19/00 |
| | | | | 715/848 |
| 7,986,825 B2* | 7/2011 | Kochi | | G06T 17/00 |
| | | | | 382/312 |
| 8,559,702 B2* | 10/2013 | Kochi | | G01C 11/02 |
| | | | | 382/312 |
| 9,213,785 B2* | 12/2015 | Plewe | | G06T 19/20 |
| 10,121,191 B2* | 11/2018 | Ninomiya | | G06Q 30/0633 |
| 10,190,791 B2* | 1/2019 | Jacobson | | G05B 15/02 |
| 10,190,792 B2* | 1/2019 | Jacobson | | F24F 11/52 |
| 10,235,493 B2* | 3/2019 | Siegel | | G06F 30/13 |
| 2002/0198611 A1* | 12/2002 | Stejskal | | G06T 19/00 |
| | | | | 700/86 |
| 2005/0065951 A1* | 3/2005 | Liston | | G06F 30/00 |
| 2005/0210444 A1* | 9/2005 | Gibson | | G06T 19/00 |
| | | | | 345/420 |
| 2006/0239539 A1* | 10/2006 | Kochi | | G06T 7/593 |
| | | | | 348/42 |
| 2007/0013690 A1* | 1/2007 | Grimaud | | G06T 19/00 |
| | | | | 715/204 |
| 2007/0262982 A1* | 11/2007 | Ninomiya | | G06F 30/13 |
| | | | | 345/419 |
| 2011/0261165 A1* | 10/2011 | Kochi | | G01C 11/02 |
| | | | | 348/46 |
| 2014/0067333 A1* | 3/2014 | Rodney | | G06T 19/00 |
| | | | | 703/1 |
| 2014/0163931 A1* | 6/2014 | Snyder | | G06F 3/0488 |
| | | | | 703/1 |
| 2014/0210824 A1* | 7/2014 | Hadley | | G06T 17/00 |
| | | | | 345/427 |
| 2016/0012160 A1* | 1/2016 | Mohacsi | | G06F 13/80 |
| | | | | 703/1 |
| 2017/0314803 A1* | 11/2017 | Jacobson | | G06F 3/04847 |
| 2017/0315696 A1* | 11/2017 | Jacobson | | G06T 19/00 |
| 2017/0315697 A1* | 11/2017 | Jacobson | | G06F 16/26 |
| 2017/0364628 A1* | 12/2017 | Siegel | | G06T 19/20 |
| 2018/0165755 A1* | 6/2018 | Ninomiya | | G06Q 30/0633 |
| 2019/0302737 A1* | 10/2019 | De Wit | | B29C 64/00 |

* cited by examiner

MODEL AND TECHNICAL DOCUMENTS

REFERENCE TO RELATED APPLICATIONS

This application claims priority to Finnish patent application no. 20205053, filed on Jan. 17, 2020, the contents of which is hereby incorporated herein by reference in its entirety.

FIELD

The present invention relates generally to computer aided modeling of structures.

BACKGROUND ART

The development of data processing systems, computer and computer applications has transformed different processes into computerized processes. An example of the computerized processes includes Building information modeling (BIM), which provides a digital representation of physical and functional characteristics of a facility. In other words, a BIM model is a shared knowledge resource for information about the facility (building) forming a reliable basis for decisions during its life-cycle. For example, in addition to a 3D model of the facility (building), different technical documents, such as engineering drawings and material lists, are created and manipulated by computer applications, based on predetermined definitions and/or definitions received as user inputs. Typically the technical documents, or more precisely, related definitions, define additional information needed in fabrication and/or building (construction) and/or maintenance, etc. A non-existing technical document required, for example in a building site to determine how to construct a connection, may cause an unnecessary delay in the building process, since the process cannot continue until the technical document is prepared and received. Such delays could be better avoided if one could easily beforehand detect non-existence of the document.

SUMMARY

The invention relates to a method, a non-transitory computer readable medium, and an apparatus, which are characterized by what is stated in the independent claims. Other embodiments are disclosed in the dependent claims.

An aspect provides a technical document space.

BRIEF DESCRIPTION OF THE DRAWINGS

In the following different embodiments of the invention will be described in greater detail with reference to the attached drawings, in which.

DETAILED DESCRIPTION OF SOME EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

The present invention is applicable to any computer-aided modeling system, and corresponding modeling applications (i.e. modeling programs), or any other system/applications configured or configurable to create and/or to manipulate and/or to manage technical documents from models created by the same or a compatible computer-aided modeling application, and/or configured or configurable to display at least different views of the model. Examples of such applications are computer aided design applications and computer aided modeling applications, such as different Building Information Modeling (BIM) applications. Current BIM applications are used to plan, design, construct, operate and maintain diverse physical structures (infrastructures), such as different buildings, roads, bridges, ports, tunnels, etc.

Various programming techniques, storage of data in memory and manners of modeling real world articles and implementing databases develop constantly. This may require extra changes in the invention. Consequently, all terms and expressions should be interpreted broadly, and they are intended to describe, not to restrict, the invention.

Figure 1:
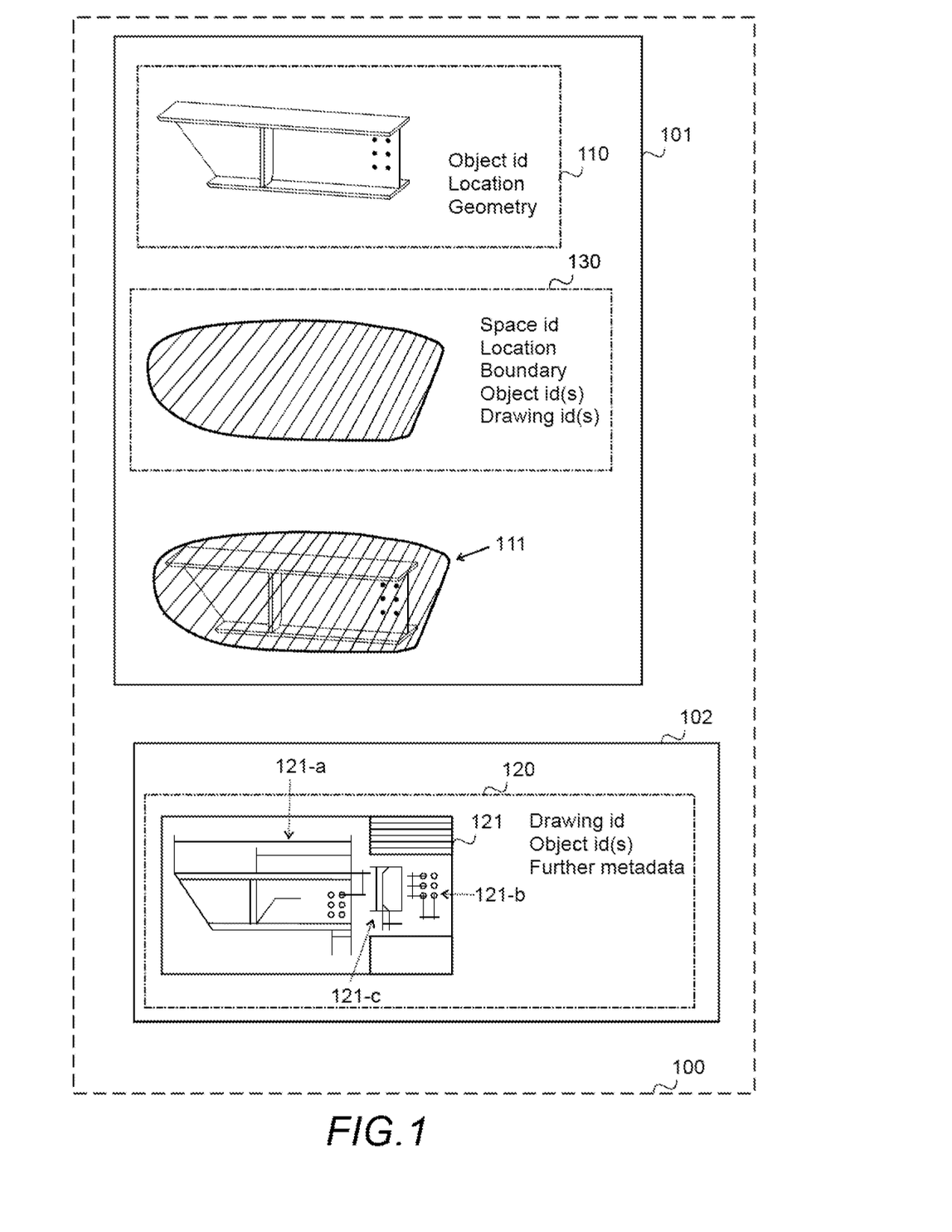
FIG. 1 is a schematic diagram depicting basic concepts.

FIG. 1 is a schematic diagram depicting basic concepts on a generalized level, using an extremely simply steel beam as an example of a modeled structure and a drawing as an example of a technical document, only for illustrative purposes, without limiting the concept thereto.

Referring to FIG. 1, a digital model 100 of a structure comprises a model data portion 101 (structural domain) and a technical document data portion 102 (technical documentation portion, technical documentation domain, documentation domain). It should be appreciated that digital model may be divided into data portions differently, or there is no division to different types of data portions.

The model data 101 of a structure, such as a building, comprises one or more objects that represent real-world articles forming the modelled structure. It should be appreciated that herein "article" means an item that will or may exist in the real world or at least is planned to exist in the real world. Further, it should be appreciated that the term "article" used herein means, in addition to one or more single pieces/items/elements, one or more parts, one or more assemblies including sub-assemblies, one or more structures forming a further structure, and one or more connections with their articles, like bolt(s), weld(s) or reinforcement splices(s).

In 3D models, an article is modeled as a 3D object 110. The definitions of an object defines at least geometrical properties of the object and its location in the model (location in 3D coordination system which is a global coordination system within the model). Typically an object is given its creation point or points, the amount of creation points depending on the article to be modeled and the modeling application used, and values for different parameters representing the physical values of the article. Examples of creation points include a starting point and an ending point of the object, or creation points defining outlines of the objects. A plurality of properties can be associated with each object that can detail, in addition to the location and geometry of the object, the manner of connectivity of the object to other objects, materials used to, or to be used to, realize the object, such as concrete, wood, steel, and other suitable properties. Further, usually each object has an identifier, which is part of the object's model data. A non-limiting example of such an identifier is a globally unique identifier (GUID). The identifier, or part of it, may be automatically created by the modeling application, or obtained as user input.

Technical document data 102 comprises one or more (digital) technical documents. A technical document covers herein anything providing additional information, for example from a dimension line or an annotation, to several different contents in one technical document. The technical document may be called also technical content, container content, technical data, additional data, additional information, additional technical information, or space content, for example. In the illustrated example the technical document data 102 comprises, as an example of technical document data, drawing data. The drawing data comprises drawing definitions for one or more engineering drawings 120. An engineering drawing 120 comprises reference(s), like object identifiers, to those objects in the model data that are at least partly included in the engineering drawing, and one or more views, called below drawing views, created based on geometrical dimensions of the object(s), and so called drawing objects defining drawing contents. The drawing views and the drawing objects define how and with which information the selected objects are outputted in the engineering drawing. A drawing object may be graphics, like 2D graphics representing a predefined standard detail, or a predefined drawing view and/or an annotation. Still a further example of a drawing object include a report, such as a table listing what the drawing contains, and a list of materials. A drawing view is a container for drawing objects. A technical drawing can include several drawing views, which usually are two-dimensional views (plane views) with possible additional information, like dimension lines, to the model. Examples of drawing views in a drawing 121 include main views 121-a, section views 121-b and single-part views 121-c.

The purpose of an engineering drawing is to capture the engineering design accurately and unambiguously. The end goal of such an engineering drawing is to convey all the required information that will answer all questions arising when the engineering drawing is used. For example, the engineering drawing should allow a manufacturer to produce the engineering design. One example of an engineering drawing is a general arrangement drawing (GA drawing), which is a contract document recording information needed to understand a general arrangement of structural elements on a project. A GA drawing may contain enlarged drawing views of complex areas and/or details, and/or other additional information, all helping in an approval process of the project and/or during installation. In other words, a GA drawing presents the overall composition of a modelled facility, such as a building. Depending on the complexity of the building, this is likely to require a number of different projections, such as plans, sections and elevations, and may be spread across several different drawings. When BIM is used, a GA drawing may be created from one or more 3D model views, from the most suitable direction, with associated schedules and on a project title sheet. For example, in plan drawings, the direction is from the top of a building or from a floor level down towards the ground. In elevation drawings the direction is from one of the sides of the building, like along a grid line. The GA drawing is the most common form of engineering drawings used by consulting structural engineers to communicate a structure sufficiently to other legal teams, public authorities, along with the design, costing and construction teams. When a drawing is opened, and if a drawing object, for example a dimension text, depends on the (model) object's corresponding dimension, the value of the dimension is obtained, by means of the reference to the part, from the model data 101, and therefore it will always be up-to-date. However, it may be that once an engineering drawing, or any document in the technical document data, becomes an official document/official technical drawing, or corresponding legal document, approved by an official, the information is locked to correspond the model data at the approval moment, and the technical document (drawing) is not any more updatable automatically to correspond the model data. The official documents, which are approved, are used to determine how a building is to be built, and if there is a disagreement, the official documents can be used to determine what was approved and is the structure according to the approved documents. Therefore it is also important to be able to check, before approval, that technical documents have been created for those portions of the model requiring official documents.

Further, usually each drawing has an identifier, such as the globally unique identifier, and each drawing view may be associated with an identifier, which may be based on the drawing identifier, or be a globally unique identifier, for example, for the drawing view. The identifier(s), or part of an identifier, may be automatically created by the modeling application.

As a new component (new object type) to the digital model, the model data 101 comprises also definitions for what is called herein a finite 3D document space 130, or shortly a document space or a document volume, the hashed portion in FIG. 1 depicting its 3D realization. Even though in the illustrated example the new component is in the model data 101, it may as well be in the technical document data 102. The document space may also be called a container space or a container volume or a boundary box or a document box or documentation box. The document space is an extrema object of a representation of a document view. The document space 130 has a closed boundary, i.e. a finite volume with a finite surface area, and a location within the model (location in 3D coordination system which is a global coordination system within the model). Below different examples how the boundary may be defined are described. Depending on an implementation, document spaces in one model may each have a similar shape, for example have a box-like shape or an ellipsoid-like shape, or the shapes may be different, regular or irregular. In other words, the actual shape form is irrelevant, as long as a finite volume with finite surface area is defined by the shape (shape definitions). The way the boundary is defined, and/or the shape of the boundary, affect what is stored in the model as boundary definition(s) so that the boundary can be defined and the document space can be displayed.

One or more modeled objects, or pieces of modeled objects, that are within one document space 130 are documented, i.e. have corresponding definitions, in one technical document or in one technical document piece, are associated with the document space 130. Therefore the document space definitions comprises references to objects and/or technical documents, for example one or more model object identifiers and/or one or more document identifiers (drawing identifiers). For example, as illustrated by a model view 111, in which both the model (beam) and the document space (hash) of the drawing 120 are displayed, the document space 130 retains the whole steel beam 110, which has the drawing 120 with different drawing views as the technical document. (Depending on an implementation, the document space definitions may have one reference, the drawing identifier of the drawing 120, or as references the drawing identifier of the drawing and the model object identifiers. However, the drawing identifier associates the document space with the model objects since the drawing in turns refers to the model objects.) A document space for a drawing view defining a detail in the drawing, for example the stiffener, would naturally retain only the stiffener in the model view, and has a reference to the specific drawing view (and possibly also the stiffener). Thanks to the one or more references, the document space is a kind of an intermediator between a technical document and the model.

Since the document space is an object, in the illustrated example it has in its definitions an identifier, generated automatically by the modeling application, for example. However, in some other implementations the document space does not have an identifier.

One may say that the document space 130, even though being, when rendered, only a finite space in a specific location, is an object defining both a) basis for contents of a technical document, or a technical document piece, so that model objects within the boundary and pieces of model objects within the boundary for those model objects that extend, on purpose, according to user input(s), outside the document space 130 are all included in the technical document, or a technical document piece, and b) location of the technical document, based on locations on objects documented in the technical document, in the model. Since technical documents may refer to one or more same objects, and a technical document may comprise more pieces for which there may be piece-specific document spaces, in addition to a document-specific space, different document spaces may overlap.

Figure 12:
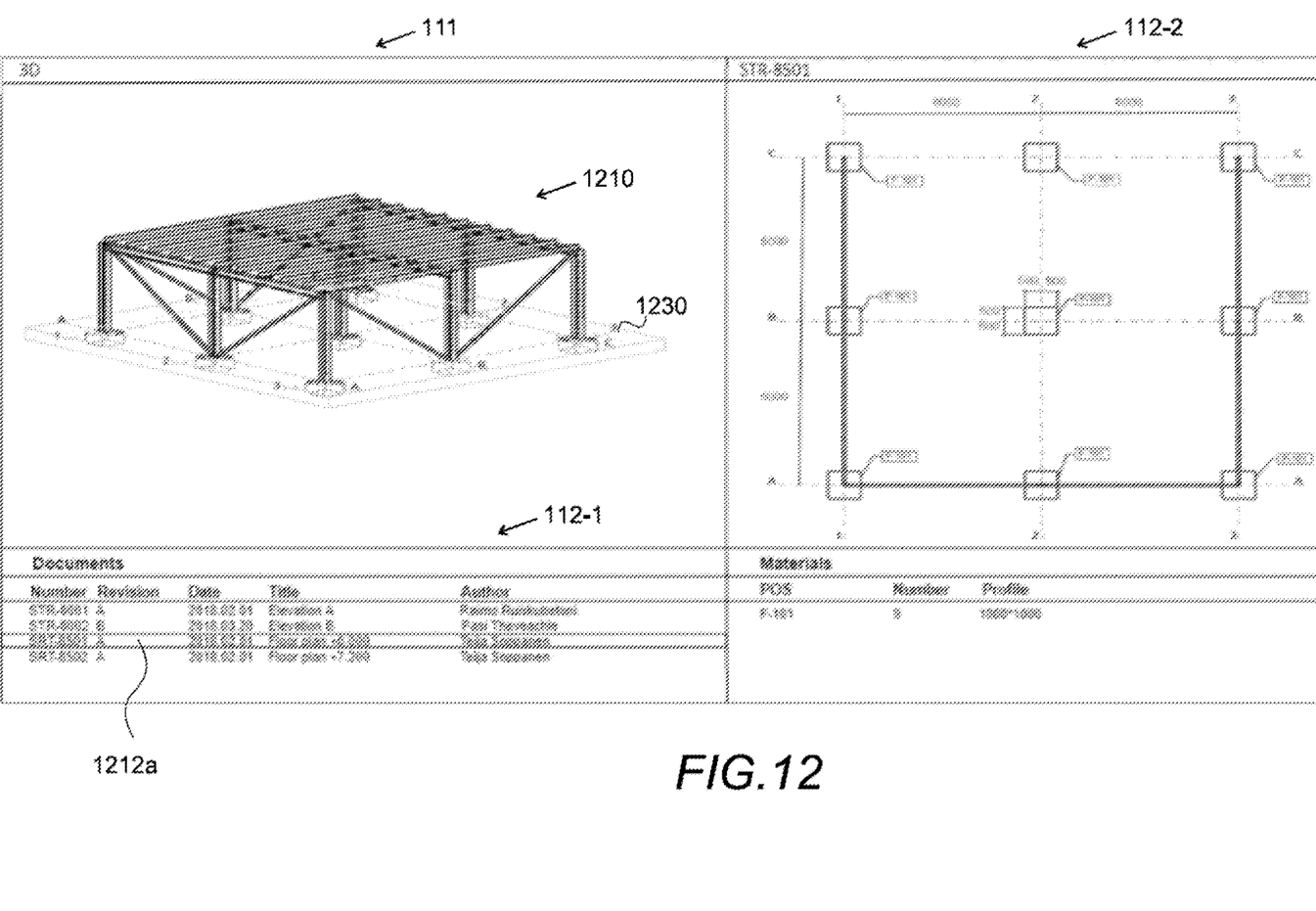

In a summary, there are two different types of representations of a model of a structure: a model view 111 which renders the structure in 3D (with the document space, as model view 111 or without the document space) and a document view 121 which renders technical documentation of the structure (usually in 2D but may be in 3D). Document spaces render in the model view 111 locations of the technical documentation (technical documents) in the model, a document space acting as a kind of an intermediator between a technical document and the model (but not being part of the technical document). Usually a document space does not render the content of the technical documentation it is related to by means of the reference. The model view 111 and the document view 121 may be displayed simultaneously, in different portions of a user interface, or overlapping at least partly. FIG. 12 illustrates an example of displaying a model view 111 and a document view, comprising in the example two portions 112-1 and 112-2, simultaneously. When the model view 111 with document spaces and the document view 121 are displayed as overlapping views, the user may not detect any difference between the different views.

Below term "part" is used for objects (model objects) representing articles for the sake of clarity.

Figure 2:
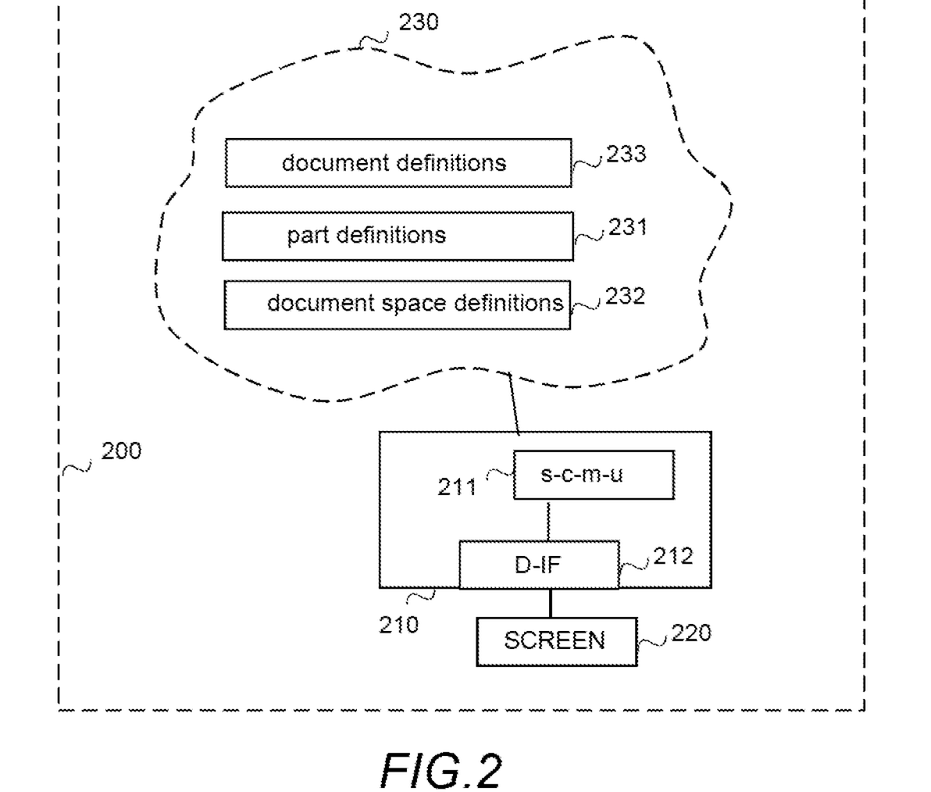
FIG. 2 shows a simplified architecture of an example of a system and a schematic block diagram of an apparatus.

FIG. 2 illustrates a simplified system describing only some logical units with their operative connections, the implementation of which may deviate from what is presented. It is obvious to a person skilled in the art that the system may also comprise other functions and structures that need not be described in greater detail here. The more detailed structure of the system is irrelevant to the actual invention.

The modeling system 200 illustrated in FIG. 2 is a simplified modeling system that comprises one or more apparatuses 210 (one is shown in FIG. 2) that are connectable to one or more data storages 230.

The apparatus 210 may be any computing device that can be configured to perform at least part of functionalities described below. For that purpose, i.e. to support the document space object type, the apparatus 210 comprises a unit 212, called herein space creation and manipulation unit (s-c-m-u) 211. The space creation and manipulation unit 211 may be part of a modeling application, or an add-in or a plug-in to the modeling application. The apparatus 210 further comprises a user interface 212, which is the interface of a user to the modeling system. The user may, depending on the capabilities and application in use, create a model, modify a model, study it, output (display, print) desired technical documents, such as the engineering drawings, and/or reports of the model, view the model, input information, including different selections, etc. by using the one or more user interfaces 212. For example, one of the interfaces 212 may be a display interface (D-IF) via which models and/or technical documents may be shown on a display screen 220. A non-limiting list of examples of apparatuses 210 includes a user terminal or a work station, such as a laptop, a smartphone, a personal computer, a tablet computer, a field device, a virtual reality device, augmented reality (AR) interface device, a web client, or a server, like a cloud server or a grid server.

The data storage 230 stores, for a digital model, part definitions 231, document space definitions 232 and technical document definitions 233. (Naturally, other information may be stored for the digital model.) The definitions may be stored in the data storage 230 as shared data. The data storage 230 may be any kind of conventional or future data repository, including distributed and centralized storing of data, managed by any suitable management system forming part of the modeling system (modeling environment). An example of distributed storing includes a cloud-based storage in a cloud environment (which may be a public cloud, a community cloud, a private cloud, or a hybrid cloud, for example). Cloud storage services may be accessed through a co-located cloud computer service, a web service application programming interface (API) or by applications that utilize API, such as cloud desktop storage, a cloud storage gateway or Web-based content management systems. Further, the modeling system 200 may comprise several servers with databases, which may be integrated to be visible to the user (user apparatus) as one database and one database server. However, the implementation of the data storage, the manner how data is stored, retrieved and updated, and the location where the part definitions, document space definitions and technical document definitions are stored are irrelevant to the invention.

In the following different examples are described without describing steps relating to connection establishment(s) to data storages to retrieve or store data. Further, it is assumed that the modeling application is running.

Figure 3:
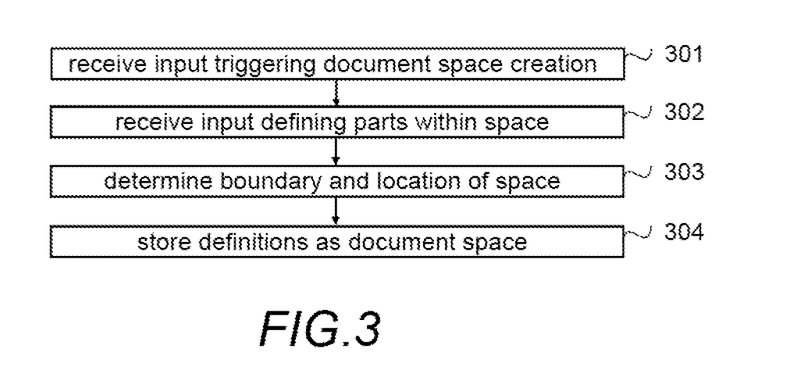
FIGS. 3 to 10 illustrate different examples of functionalities.

FIG. 3 illustrates an example of a functionality of a user apparatus, and more precisely an example of a functionality of the space creation and manipulation unit the user apparatus comprises.

Referring to FIG. 3, a user input triggering creation of a document space is received in step 301. The user input may be "create this type of technical document", "create an engineering drawing", "create a drawing view", or simply "create a document space", for example.

Then one or more user inputs, which define parts that will be within the document space, are received in step 302. The user input(s) may be selecting parts that should be within the document space, and/or the user input may be creating the document space by defining its boundary. For example, for a box shape document space eight vertices, and/or twelve edges in their location in the 3D model may be defined. Another example for a box shape includes defining in 3D space six sides, wherein each side is 2D quadrilateral plane that is connected to four other sides. Still a further possibility for a box shape is to use axis-aligned planes, defined by two coordinate axes. Further, the modeling application may be configured with a clip plane functionality, which uses a selected point in the model, selected face normal (face may be a slanted face) and a work area extrema, which is typically selected by a user, for defining a clipped area. The clipped area is a plane defined at the selected point with the selected normal, bounded by the work area, and it can be used for defining document space for box shapes. The user input(s) defining parts that will be within the document space may include selection of the document space shape in implementations configured to support more than one type of shapes.

Once a user input indicating ending of the definition step 302 is received, the boundary of the document space is determined in step 303 as well as the location of the document space in the model. If the user input(s) in step 302 include selecting the one or more parts, either one by one and/or using a group selecting tool, extreme points in 3D are defined, based on the selected parts, and then a selected or default shape of the document space is used with the extreme points in 3D to determine the boundary in such a way that the extreme points are within the boundary. This ensures that all selected parts are within the boundary.

When the boundary and the location are determined, their definitions are stored in step 304 as a document space (document space object). The definitions may include an identifier for the document space, and/or identifiers of the parts that are wholly or partly within the document space. If the user input indicating ending of the definition step 302 causes a technical document or a technical document piece to be created and stored, the definitions include a reference to the technical document/technical document piece, for example a document identifier. The reference may be the technical document itself. The document space that does not refer to a technical document, or to a technical document piece, may be stored in step 304 temporarily, and only after there is a technical document defined and referred in the document space, the document space is stored permanently to be part of the model. In such an implementation, when the modeling application is closed, temporarily stored document spaces are lost. However, in another implementation a document space that do not refer to a technical document/ technical document piece may nevertheless be stored permanently to be part of model, to be used later for document creation. In such an implementation document spaces without a reference to a technical document/document piece may be displayed differently than document spaces with a reference to a technical document/technical document piece.

It depends on the shape and implementation, possible also on the used way to create a document space 130, what is included document space definitions.

Figure 4:
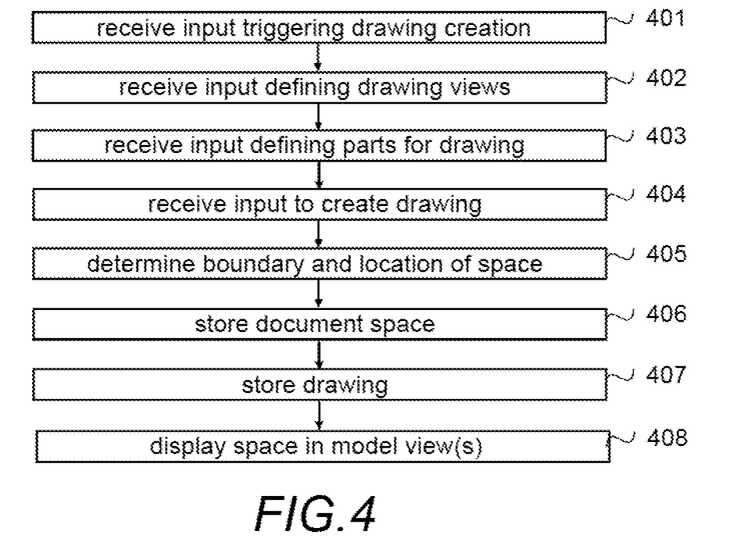

FIG. 4 illustrates an example of a functionality of a user apparatus, and more precisely an example of a functionality of a modeling application with the space creation and manipulation unit in the user apparatus. In the illustrated example document spaces are created automatically, as in integral part of the drawing creation process. It should be appreciated that applying similar principles to creation process of other technical documents is a straightforward solution for one skilled in the art, based on the teachings in FIG. 4.

Referring to FIG. 4, steps 401 to 404 relate to drawing creation, and depending on the modeling application and/or user preferences there are several ways to perform them. Since any known and future way may be used, and the drawing creation as such is not affected, it suffices to describe the drawing creation steps in a very general level.

The process in FIG. 4 starts when a user input triggering drawing creation is received in step 401. In the illustrated example it is assumed that drawing creation includes receiving in step 402 one or more user inputs which define one or more drawing views, and receiving in step 403 one or more user inputs which define one or more parts that are to be included into a drawing (or drawing view) that is being created. Once a user input indicating explicitly or indirectly to create the drawing (or drawing view) is received in step 404, it triggers automatically, as a new step, creation of a document space for the drawing (or drawing view). If the parts were explicitly selected, the document space is created by determining in step 406, based on the selected parts, a boundary and a location for the document space. The boundary is determined, as described with step 303, by defining extreme points, based on the selected parts, and then a default (or a previously selected) shape of the document space is used with the extreme points in 3D to determine the boundary in such a way that the extreme points are within the boundary. If the parts were implicitly selected by user inputs defining the boundary, the boundary and its location is determined while the parts are selected (i.e. steps 403 and 405 are merged).

Then the document space (boundary and location) is stored in step 406, with reference to the drawing (or drawing view) and with references to the selected parts. Naturally, also definitions for the drawing (or drawing view) are stored in step 407. Further, in the illustrated example it is assumed that the created document space is displayed in step 408 in a model view (assuming that the model view is open and the document space locates in the model within the displayed model view).

Figure 11A:
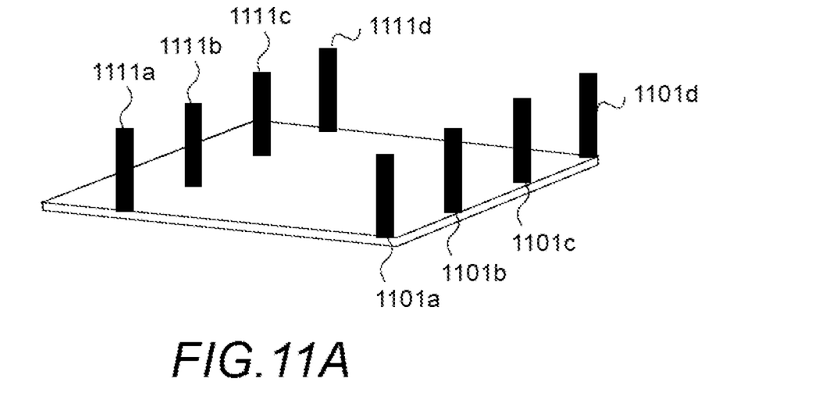
FIGS. 11A to 11D and 12 illustrate different model views.
Figure 11B:
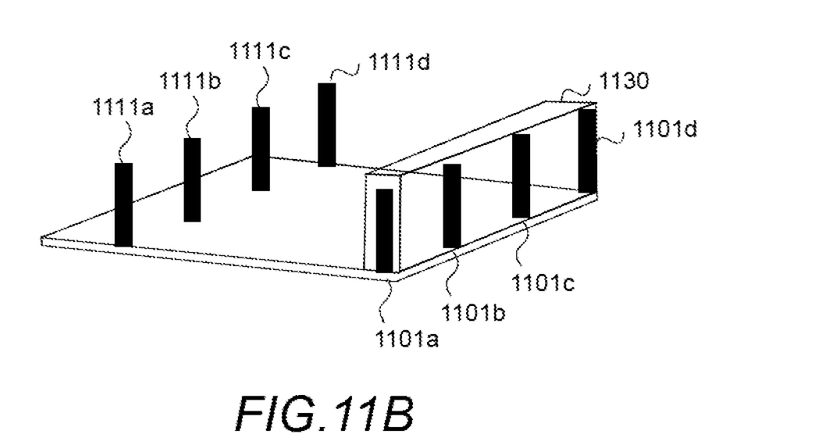

Using the process of FIG. 4 and examples illustrated in FIGS. 11A and 11B, a model view illustrated in FIG. 11A may be displayed, and parts 1101*a*, 1101*b*, 1101*c* and 1101*d* may be selected to be included into a drawing. Using their extreme points and location, and a box shape, document space 1130 illustrated in FIG. 11B is created automatically, corresponding definitions are stored and the document space being displayed in the model view.

Figure 5:
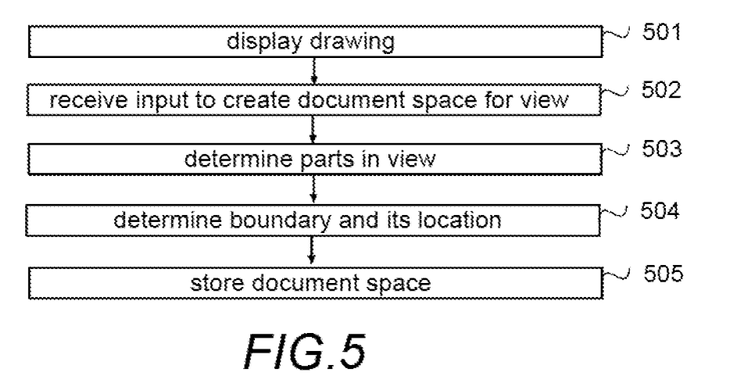

FIG. 5 illustrates an example of a functionality of a user apparatus, and more precisely an example of a functionality of the space creation and manipulation unit the user apparatus comprises. In the illustrated example a model with drawings has been created with a legacy modeling application that did not create document spaces. It should be appreciated that applying similar principles to creation process of document spaces based on other technical documents is a straightforward solution for one skilled in the art, based on the teachings in FIG. 5.

Referring to FIG. 5, when a drawing is displayed (step 501) and a user input to create a document space for a view in the drawing is received (step 502), parts in the view are identified in step 503, based on references to parts, stored in the drawing definition. The view may be one of the views in the drawing, or the whole drawing, depending on the user input. The document space is created by determining in step 504, based on the determined parts, a boundary and a location for the document space, as described above with corresponding step 405. Then the document space (boundary and location) is stored in step 505, with reference to the drawing (or drawing view) and/or with reference to the determined parts.

In another implementation, before creating the document space, it is checked, whether a document space for the drawing (drawing view) already has been created, and the document space is created only if it does not exits already. The checking may be performed after step 502, using the drawing identifier (view identifier), or after step 503, using the drawing identifier (view identifier) and the part identifiers, for example, to find out whether the model comprises a document space having the same identifiers as reference information.

Figure 6:
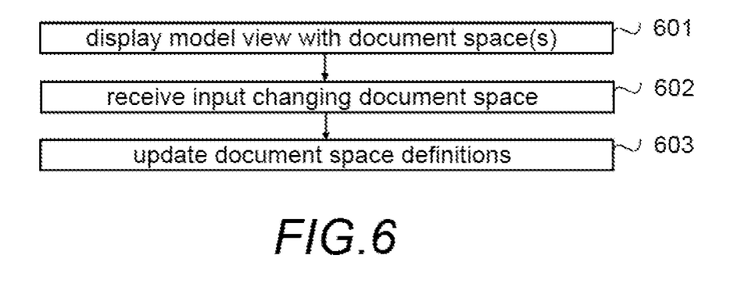

FIG. 6 illustrates an example of a functionality of a user apparatus, and more precisely an example of a functionality of the space creation and manipulation unit the user apparatus comprises when an existing document space is manipulated.

Referring to FIG. 6, when a model view with one or more document spaces is displayed (step 601), for example the view illustrated in FIG. 11B, the user may modify a document space, or document spaces. When a user input changing (modifying) a document space is received (step 602), the document space definitions are updated correspondingly in step 603. The document space may be manipulated in the same ways as parts, i.e. their size, location etc. may be modified. Examples of manipulation include dragging-and-dropping and typing exact dimensions. The updating includes deleting references to parts that are not any more within the document space and adding references to parts that are after the change within the document space but were not before the change. The same applies when user input deleting a part is received, or a user input adds a new part that is within the document space, or at least partly in the document space. When a technical document referred in the document space is opened, the changes are propagated to the document.

Figure 11C:
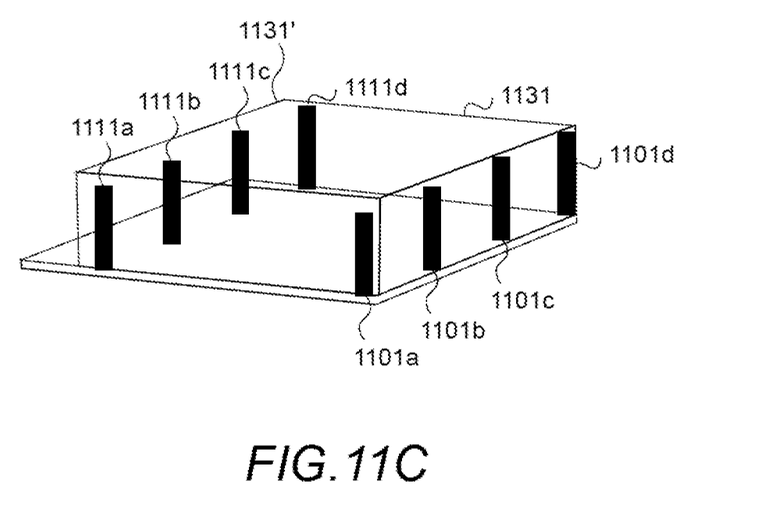

Using the process of FIG. 6 and examples illustrated in FIGS. 11B and 11C, a user input dragging a side of a plane defining the document space 1130 towards the other end, denoted by 1131' in FIG. 11C, the document space becomes larger, as illustrated by the document space 1131' in FIG. 11C and it will include also parts 1111*a*, 1111*b*, 1111*c* and 1111*d*. The boundary in the document space definitions is updated correspondingly, and references to the new parts 1111*a*, 1111*b*, 1111*c* and 1111*d* are added to the document space definitions.

Figure 7:
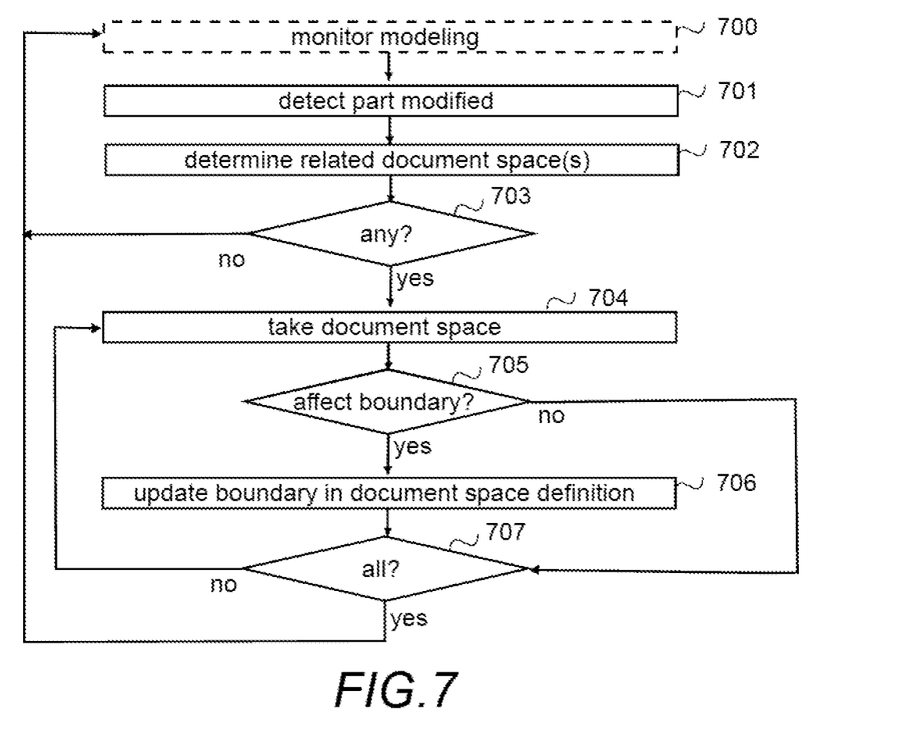

FIG. 7 illustrates an example of a functionality of a user apparatus, and more precisely an example of a functionality of the space creation and manipulation unit the user apparatus comprises when an existing model part is manipulated.

Referring to FIG. 7, modeling is monitored (step 700) and when it is detected in step 701 that an existing part is modified, related document spaces are determined in step 702. For example, using the part identifier those document spaces including in their definitions the part identifier, are determined. If there are no related document spaces (step 703: no), the process continues monitoring the modeling (step 700).

If there are one or more related document spaces (step 703: yes), a document space is taken in step 704, and it is checked in step 705, whether the modification affects the boundary of the document space. It depends on implementation and/or settings which is considered to affect the boundary. Naturally, if after the modification the part is within the boundary, it does not affect the boundary. If the part was originally within the boundary but after the modification it is not within the boundary, or is only partially within the boundary, that may be considered to affect the boundary, especially if the part was explicitly selected. If the part was originally in the boundary (extreme point) but after the modification it is not in the boundary even though it still is within the boundary, or is only partially within the boundary, that may be considered to affect the boundary, unless user inputs explicitly defined the boundary. The boundary may be also locked, the locking not allowing any changes to the boundary, in which case the modification does not affect the boundary of the document space. Naturally, other rules may be applied. For example, the user may be prompted to provide answer to a question "should document space be modified correspondingly".

If the modification affects the boundary (step 705: yes), dimensions for the new boundary are determined in step 706, using the same principles for boundary definitions as explained above with steps 303 and 406, and the boundary is updated in step 706 in the document space definitions correspondingly.

Then the process continues to step 707 to check, whether all related document spaces have been checked. If not (step 707: no), the process continues to step 704 to take another document space to be checked, whether its boundary is affected. If all related document spaces have been checked (step 707: yes), the process continues monitoring the modeling (step 700).

If the modification does not affect the boundary (step 705: no), the process continues to step 707 to check, whether all related document spaces have been checked.

Figure 11D:
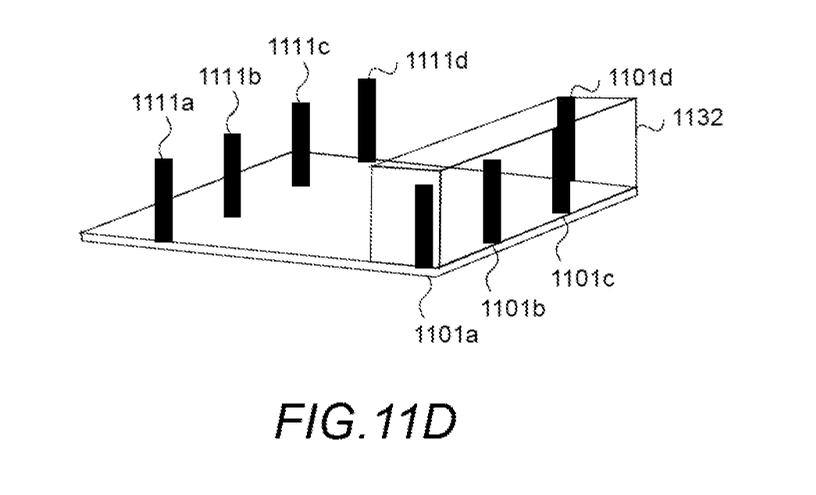

Using the process of FIG. 7 and examples illustrated in FIGS. 11B and 11D, a user input changing a location of part 1101*d* which is within the document space 1130 in FIG. 11B to a location in which the part 1101*d* is not any more within the document space 1130, the document space is updated, as shown by the document space 1132 in FIG. 11D, so that the part 1101*d* is within the larger document space 1132. Even though in FIG. 11D the shape remained the box, in other implementations the shape of the document space may change. For example, the shape could have an L-shape cross-section.

Figure 8:
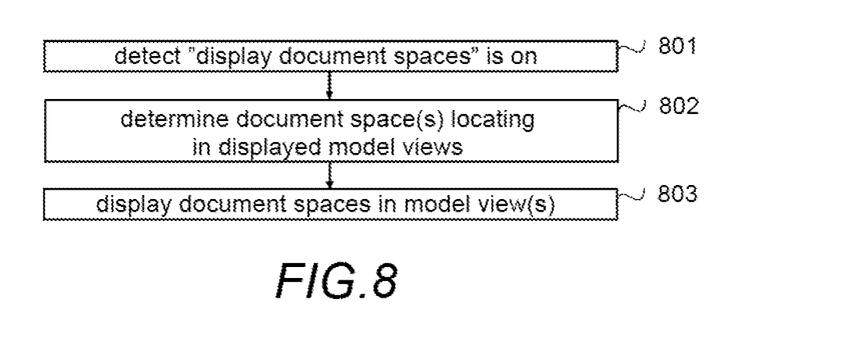

FIG. 8 illustrates an example of a functionality of a user apparatus, and more precisely an example of a functionality of the space creation and manipulation unit the user apparatus comprises when one or more model views are displayed.

Referring to FIG. 8, when it is detected in step 801 that document spaces are to be displayed, document spaces that locate in the model in the model view that is displayed are determined in step 802, for example using the locations in the document space definitions, and the document spaces are displayed in step 803 in corresponding one or more model views. Detecting that document spaces are to be displayed (step 801) may be based on model view settings, or change in the model view settings, or a user input instructing to display document spaces.

Depending on the implementations, the document space may be displayed with a transparent fill, possibly using another color, and/or the parts outside the document space may be displayed dimmed (frosted, as ghost). The above lists is a non-limiting list, there are no restrictions how to display document spaces. Further alternatives include using different colors, a color of a document space indicating a type of a referred technical document.

Using the process of FIG. 8 and examples illustrated in FIGS. 11A and 11B, a model view illustrated in FIG. 11A may be displayed first, and then a model view illustrated in FIG. 11B is displayed. As can be seen, it is very easy for the user to notice that there are no technical document for parts 1111*a*, 1111*b*, 1111*c* and 1111*d*, and the user can immediately start to define the technical document(s), or include them to the existing technical document created, as described above with FIG. 6.

Figure 9:
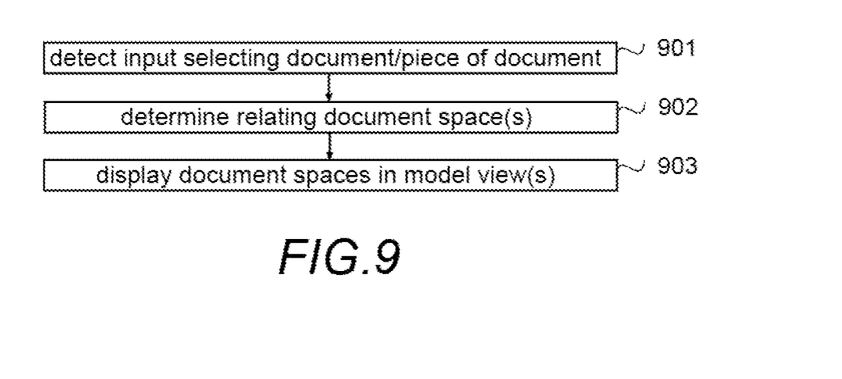

FIG. 9 illustrates an example of a functionality of a user apparatus, and more precisely an example of a functionality of the space creation and manipulation unit the user apparatus comprises, when one or more model views may be displayed simultaneously with one or more technical documents and/or one or more technical document pieces and/or one or more lists listing technical documents. In the example below, it is assumed, for the sake of clarity, that one or more model views are already being displayed, and that document spaces to be displayed locate within the displayed one or more model views.

Referring to FIG. 9, when it is detected in step 901 that a user input selecting a document (document piece), document spaces relating to the selected document (document piece) are determined in step 902, for example using the document identifier to find those document spaces which have in their document space definitions corresponding references, i.e. the same identifier, and determined one or more the document spaces are displayed in step 903 in displayed one or more model views. The document spaces may be displayed until another user input selecting a new technical document is received or until a user input instructing not to display document spaces is received.

An example of user inputs selecting a document includes a user input relating to adding one or more new document pieces to an existing technical document, for example adding drawing views to an existing drawing. The document space of the technical document may then be displayed in the model view as long as the adding the views is going on.

Other examples of user inputs selecting a document or a document piece include a user input selecting a document piece, or a document, in a displayed document view, a user selecting a document in a list listing existing documents of the model, and a user selecting a document piece in a list listing existing document pieces, such as different drawing views.

If a document space determined in step 902 does not locate within the displayed one or more model views, a corresponding model view may be automatically zoomed so that the document space can be displayed, or the user may be prompted that the document space locates outside the displayed one or more model views.

If no model view is displayed when the input in step 901 is received, the user interface may be reorganized automatically to display in step 903 a model view within which the relating document spaces locates.

Using the process of FIG. 9 and example illustrated in FIG. 12, at least following scenarios are envisaged. It should be appreciated that the list of the scenarios is non-limiting, and further scenarios are possible.

In the beginning a document view 112-1 is displayed, the document view 112-1 displaying a list of technical documents created fora model. Then a user input selecting from the list a technical document 1212*a* is received with a command/indication "show its document space". Therefore, in addition to the document view 112-1, also a model view 111 is displayed, rendering both the model 1210 and a document space 1230 of the technical document 1212*a*.

In the beginning the document view 112-1 is displayed. Then a user input selecting from the list a technical document 1212*a* is received with a command/indication "show technical document", resulting to a document view displaying either both the document view 112-1 and a document view 112-2, or only the document view 112-2. The document view 112-2 renders information (content) of the selected technical document. In the illustrated example the information comprises, from top to bottom, a name of the technical document, a GA drawing and a material list of parts in the GA drawing. Then in the document view 112-2 a user input with a command/indication "show its document space" is received, resulting to the user interface displaying both document views 112-1, 112-2 and the model view 111 rendering both the model 1210 and the document space 1230. The same result is obtained, if the user input is a user input selecting from the list the technical document 1212*a* with a command/indication "show its document space".

In the beginning the document view 112-1 is displayed. Then a user input selecting from the list a technical document 1212*a* is received with a command/indication "show technical document and its document space". The result is the user interface displaying both document views 112-1, 112-2 and the model view 111 rendering both the model 1210 and the document space 1230.

In the beginning the document view 112-2 rendering information is displayed. Then in the document view 112-2 a user input with a command/indication "show document space of this technical document" is received, resulting to the user interface displaying the document view 112-1, and the model view 111 rendering both the model 1210 and the document space 1230.

In the beginning the document view 112-2 rendering information is displayed. Then in the document view 112-2 a user input with a command/indication "show document space of this technical document and a document list" is received. The result is the user interface displaying both document views 112-1, 112-2 and the model view 111 rendering both the model 1210 and the document space 1230. In an implementation, the document 1212*a* may be indicated, for example by bolding or highlighting, in the document view 112-1.

Figure 10:
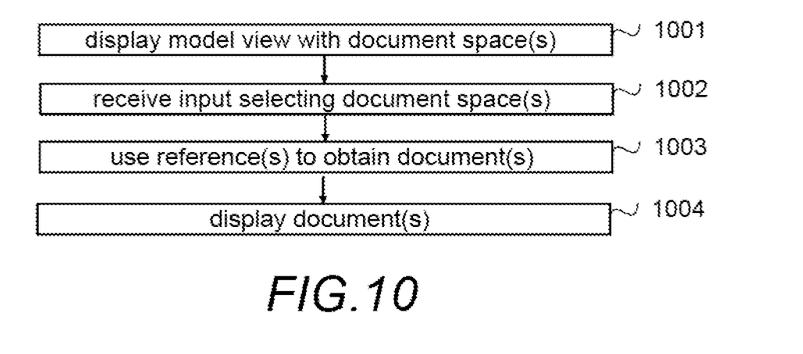

FIG. 10 illustrates an example of a functionality of a user apparatus, and more precisely an example of a functionality of the space creation and manipulation unit the user apparatus comprises, when one or more model views may be displayed simultaneously with one or more technical documents and/or one or more technical document pieces and/or one or more lists listing technical documents.

Referring to FIG. 10, a model view with one or more document spaces is displayed (step 1001), and a user input selecting one or more documents spaces is detected in step 1002, the user input indicating to display corresponding (related) technical documents. Document space definitions are then used in step 1003 to obtain (retrieve) the one or more technical documents of the selected one or more document spaces. More precisely, a reference to a technical document in document space definitions of a selected document space is used to obtain the technical document. Then the obtained one or more technical documents are displayed in step 1004 in one or more document views, which render the information in the obtained one or more technical documents.

Using the process of FIG. 10 and the example illustrated in FIG. 12, at the beginning of the process the model view 111 is displayed, rendering both the model 1210 and the document space 1230. Then a user input selecting the document space 1230 is detected. If the user input indicates "display corresponding technical document", the document view 112-2 rendering information (content) of the selected technical document is displayed with the model view 111. If the user input indicates "display corresponding technical document with technical document list", the result is the user interface displaying the model view 111 and both document views 112-1, 112-2. In an implementation, the document 1212*a* may be indicated, for example by bolding or highlighting, in the document view 112-1.

In another scenario, at the beginning the model view 111, rendering both the model 1210 and the document space 1230, and the document view 112-1 rendering the document list is displayed, and the user input selecting the document space 1230 and indicating "display corresponding technical document", result is the user interface displaying the model view 111 and both document views 112-1, 112-2.

As is evident from the above examples, the document space provides a tool to assist management of technical documents. More specifically, using reference numbers in the above figures, the document space 130, 1230 provides a foundation to manage technical documents 120 in several ways. A user is A user is able to see (FIGS. 4, 8 and 9) the created (FIGS. 3 and 5) documents spaces in 3D view and manage (FIGS. 6, 7 and 10) them. To elaborate a little bit more: the user can easily understand technical document positioning 1230 in the 3D-model 1210. The user can edit and control the document spaces intuitively in 3D models (FIG. 6 together with FIGS. 11B, 11C, 11D). With document spaces a user obtains easily an answer to variable questions, like what is the coverage of a technical documentation of a project, from where is this technical document in the model, are there any overlapping technical documents, is there any undocumented area in the model, is there any technical document in a specific area in the model, just to list some questions. The document spaces 130, 1230 also improve required efforts required to create General Arrangement drawings, as explained with FIGS. 3 and 4. In an update situation, the document space may move along, and/or change size, with the parts and keep the position (FIG. 7, FIGS. 11A to 11D). In future, document spaces 130, 1230 may replace state of the art technical documents 120 comprising specific definitions in the technical data portion 102, and corresponding information may be stored, obtained and viewed via document spaces 130, 1230 in the 3D space, currently used for structural domain (structural space.

The steps and related functions described above in FIGS. 3 to 10 are in no absolute chronological order, and some of the steps may be performed simultaneously or in an order differing from the given one. Other functions can also be executed between the steps or within the steps. Some of the steps or part of the steps can also be left out or replaced by a corresponding step or part of the step. For example, instead of displaying model view(s) and document view(s) simultaneously in the processes of FIGS. 9 and 10, the result of the process of FIG. 9 may be that only model view is displayed and the result of the process of FIG. 10 may be that only document view is displayed.

The techniques described herein may be implemented by various means so that an apparatus implementing one or more functions/operations described above with an embodiment/example, for example by means of any of FIGS. 1 to 12 and any combination thereof, comprises not only prior art means, but also means for implementing the one or more functions/operations of a corresponding functionality described with an embodiment, for example by means of any of FIGS. 1 to 12 and any combination thereof, and it may comprise separate means for each separate function/operation, or means may be configured to perform two or more functions/operations. For example, one or more of the means and/or a space creation and manipulation unit, or any corresponding unit, for one or more functions/operations described above may be software and/or software-hardware and/or hardware and/or firmware components (recorded indelibly on a medium such as read-only-memory or embodied in hard-wired computer circuitry) or combinations thereof. Software codes may be stored in any suitable, processor/computer-readable data storage medium(s) or memory unit(s) or article(s) of manufacture and executed by one or more processors/computers, hardware (one or more apparatuses), firmware (one or more apparatuses), software (one or more modules), or combinations thereof. For a firmware or software, implementation can be through modules (e.g., procedures, functions, and so on) that perform the functions described herein.

Figure 13:
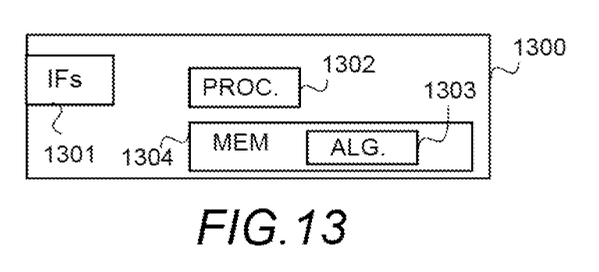
FIG. 13 is a schematic block diagram.

FIG. 13 is a simplified block diagram illustrating some units for an apparatus 1300 comprising the space creation and manipulation unit, or any corresponding unit or sub-units, or configured otherwise to perform at least some functionality described above, for example by means of any of FIGS. 1 to 12 and any combination thereof, or some of the functionalities if functionalities are distributed in the future. In the illustrated example, the apparatus comprises one or more interface (IF) entities 1301, such as one or more user interfaces, one or more processing entities 1302 connected to various interface entities 1301 and to one or more memories 1304.

The one or more interface entities 1301 are entities for receiving and transmitting information, such as communication interfaces comprising hardware and/or software for realizing communication connectivity according to one or more communication protocols, or for realizing data storing and fetching (obtaining, retrieving), or for providing user interaction via one or more user interfaces. The one or more user interfaces may be any kind of a user interface, for example a screen, a keypad, or an integrated display device or external display device.

A processing entity 1302 is capable to perform calculations and configured to implement at least the space creation and manipulation unit, described herein, or at least part of functionalities/operations described above, for example by means of any of FIGS. 1 to 12 and any combination thereof, as a corresponding unit or a sub-unit if distributed scenario is implemented, with corresponding algorithms 1303 stored in the memory 1304. The entity 1302 may include a processor, controller, control unit, micro-controller, unit, module, etc. suitable for carrying out embodiments or operations described above, for example by means of any of FIGS. 1 to 12 and any combination thereof. Generally the processor is a central processing unit, but the processor may be an additional operation processor.

A memory 1304 is usable for storing a computer program code required for the space creation and manipulation unit, or for any corresponding unit or sub-units, or for one or more functionalities/operations described above, for example by means of any of FIGS. 1 to 12 and any combination thereof, i.e. the algorithms for implementing the functionality/operations described above by means of any of FIGS. 1 to 12 and any combination thereof. The memory 1304 may also be usable for storing other possible information, like the document space definitions, model definitions and/or technical documents and temporarily stored information.

As a summary, the space creation and manipulation unit/sub-units and/or algorithms for functions/operations described herein, for example by means of means of any of FIGS. 1 to 13 and any combination thereof, may be configured as a computer or a processor, or a microprocessor, such as a single-chip computer element, or as a chipset, or one or more logic gates including at least a memory for providing storage area used for arithmetic operation and an operation processor for executing the arithmetic operation. The space creation and manipulation unit/sub-units and/or algorithms for functions/operations described above, for example by means of means of any of FIGS. 1 to 12 and any combination thereof, may comprise one or more computer processors, application-specific integrated circuits (ASIC), digital signal processors (DSP), digital signal processing devices (DSPD), programmable logic devices (PLD), field-programmable gate arrays (FPGA), graphics processing units (GPU), and/or other hardware components that have been programmed and/or will be programmed by downloading computer program code (one or more algorithms) in such a way to carry out one or more functions of one or more embodiments/examples.

An embodiment provides a computer program embodied on any client-readable distribution/data storage medium or memory unit(s) or article(s) of manufacture, comprising program instructions executable by one or more processors/computers, which instructions, when loaded into an apparatus, constitute the space creation and manipulation unit or an entity providing corresponding functionality, or at least part of the corresponding functionality. Programs, also called program products, including software routines, program snippets constituting "program libraries", applets and macros, can be stored in any medium and may be downloaded into an apparatus. In other words, each or some or one of the units/sub-units and/or the algorithms for one or more functions/operations described above, for example by means of means of any of FIGS. 1 to 12 and any combination thereof, may be an element that comprises one or more arithmetic logic units, a number of special registers and control circuits.

It will be obvious to a person skilled in the art that, as the technology advances, the inventive concept can be implemented in various ways. The invention and its embodiments are not limited to the examples described above but may vary within the scope of the claims.

What is claimed is:

1. A method comprising:
   processing, by a modeling application running in a computing device, a digital model for a building, the digital model comprising definitions defining (i) a plurality of parts, (ii) technical documents, and (iii) document spaces, wherein:
   (i) the plurality of parts model, in a global three-dimensional coordinate system of the digital model, one or more pieces belonging to the building,
   (ii) the technical documents include engineering drawings that convey information relating to the plurality of parts, and
   (iii) the document spaces each define a finite volume having a location in the global three-dimensional coordinate system of the digital model and a reference to at least one of the technical documents, wherein at least one of the finite volumes overlaps with one or more parts amongst the plurality of parts and extends beyond boundaries of the one or more parts to include space between the one or more parts that is outside boundaries of the digital model, and each document space is determined by the modeling application based on the one or more parts on which the at least one technical document conveys information, wherein the finite volumes of different ones of at least some of the document spaces overlap;
   displaying, on a display of the computing device, a three-dimensional model view rendering at least some of the plurality of parts modeling corresponding pieces of the building;
   detecting, by the computing device, a user input with an indication to display document spaces;
   displaying, on the display of the computing device and in response to the indication, in the three-dimensional model view, one or more of the document spaces located at least partly within the displayed three-dimensional model view;
   identifying, within the displayed three-dimensional model view, at least one first part of the plurality of parts that is not associated with any of the technical documents, the at least one first part identified by virtue of not being included in any of the one or more displayed document spaces, and
   identifying, within the displayed three-dimensional model view, at least one second part of the plurality of parts that is associated with one or more of the technical documents, the at least one second part identified by virtue of being included in at least one of the one or more displayed document spaces.

2. The method of claim 1, further comprising:
   displaying a document view rendering the information in at least one of the technical documents;
   detecting, in the document view, a user input with an indication to display a location in the digital model of one or more parts amongst the plurality of parts to which the information in the at least one technical document relates;
   determining, in response to said user input, at least one of the document spaces having reference to the technical document; and
   displaying the at least one document space in the three-dimensional model view.

3. The method of claim 2, further comprising:
   displaying a list including at least some of the technical documents in the document view;
   detecting, in the document view, a user input selecting one or more of the technical documents in the list;
   determining, in response to said user input, for each selected technical document, one or more of the document spaces having reference to the technical document; and
   displaying the one or more document spaces in the three-dimensional model view.

4. The method of claim 1, further comprising:
   detecting, in the three-dimensional model view, a user input further selecting one or more of the displayed document spaces;
   using, in response to said user input, references, which the one or more document spaces selected have, to obtain corresponding technical documents; and
   displaying one or more document views rendering the information in the one or more technical documents obtained.

5. The method of claim 1, further comprising:
   detecting a user input creating a new technical document;

determining, based on parts of the plurality of parts that the new technical document refers to, a finite volume and a location within the digital model for a new document space;
displaying the new document space in the three-dimensional model view; and
storing the new document space with the finite volume and the location and a reference to the new technical document to the digital model.

6. The method of claim 1, further comprising:
detecting a user input defining a new document space in the three-dimensional model view, wherein the defining comprises defining a finite volume and a location within the digital model of the new document space;
displaying the new document space in the three-dimensional model view; and
storing at least temporarily the new document space with the finite volume and the location to the digital model.

7. The method of claim 6, further comprising:
receiving the user input to further create a new technical document from the new document space;
determining parts amongst the plurality of parts within the finite volume;
creating the new technical document based on the parts;
storing the new technical document; and
storing the new document space with the finite volume, the location and reference to the new technical document.

8. A non-transitory computer readable medium comprising program instructions for causing a computing device running a modeling application at least to perform steps comprising:
processing a digital model for a building, the digital model comprising definitions defining (i) a plurality of parts, (ii) technical documents, and (iii) document spaces, wherein:
(i) the plurality of parts model, in a global three-dimensional coordinate system of the digital model, one or more pieces belonging to the building,
(ii) the technical documents include engineering drawings that convey information relating to the plurality of parts, and
(iii) the document spaces each define a finite volume having a location in the global three-dimensional coordinate system of the digital model and a reference to at least one of the technical documents, wherein at least one of the finite volumes overlaps with one or more parts amongst the plurality of parts and extends beyond boundaries of the one or more parts to include space between the one or more parts that is outside boundaries of the digital model, and each document space is determined based on the one or more parts on which the at least one technical document conveys information, wherein the finite volumes of different ones of at least some of the document spaces overlap;
displaying, on a display of the computing device, a three-dimensional model view rendering at least some of the plurality of parts modeling corresponding pieces of the building; and
displaying, on the display of the computing device and in response to detecting a user input with an indication to display document spaces, in the three-dimensional model view, one or more of the document spaces located at least partly within the displayed three-dimensional model view;

identifying, within the displayed three-dimensional model view, at least one first part of the plurality of parts that is not associated with any of the technical documents, the at least one first part identified by virtue of not being included in any of the one or more displayed document spaces, and
identifying, within the displayed three-dimensional model view, at least one second part of the plurality of parts that is associated with one or more of the technical documents, the at least one second part identified by virtue of being included in at least one of the one or more displayed document spaces.

9. The non-transitory computer readable medium of claim 8, further comprising program instructions for causing the computing device at least to perform:
displaying a document view rendering the information in at least one of the technical documents;
detecting, in the document view, a user input with an indication to display a location in the digital model of one or more parts amongst the plurality of parts to which the information in the at least one technical document relates;
determining, in response to said user input, at least one of the document spaces having reference to the technical document; and
displaying the at least one document space in the three-dimensional model view.

10. The non-transitory computer readable medium of claim 8, further comprising program instructions for causing the computing device at least to perform:
using, in response to user input in the three-dimensional model view selecting one or more of the displayed document spaces, references, which the one or more document spaces selected have, to obtain corresponding technical documents; and
displaying one or more document views rendering the information in the one or more technical documents obtained.

11. The non-transitory computer readable medium of claim 8, further comprising program instructions for causing the computing device at least to perform:
detecting a user input creating a new technical document;
determining, based on parts of the plurality of parts that the new technical document refers to, a finite volume and a location within the digital model for a new document space;
displaying the new document space in the three-dimensional model view; and
storing the new document space with the finite volume and the location and a reference to the new technical document to the digital model.

12. The non-transitory computer readable medium of claim 8, further comprising program instructions for causing the computing device at least to perform:
detecting a user input defining a new document space in the three-dimensional model view, wherein the defining comprises defining a finite volume and a location within the digital model of the new document space;
displaying the new document space in the three-dimensional model view;
receiving a user input to create a new technical document from the new document space;
determining parts amongst the plurality of parts within the finite volume;
creating the new technical document based on the parts;
storing the new technical document; and storing to the model the new document space with the finite volume, the location and reference to the new technical document.

13. An apparatus comprising:
at least one user interface;
at least one processor; and
at least one memory including computer program code,
wherein the at least one processor executes the computer program code included in the at least one memory to cause the apparatus at least to perform steps comprising:
running a modelling application processing a digital model for a building, the digital model comprising definitions defining (i) a plurality of parts, (ii) technical documents, and (iii) document spaces, wherein:
(i) the plurality of parts model, in a global three-dimensional coordinate system of the digital model, one or more pieces belonging to the building,
(ii) the technical documents include engineering drawings that convey information relating the plurality of parts, and
(iii) the document spaces each define a finite volume having a location in the global three-dimensional coordinate system of the digital model and a reference to at least one of the technical documents, wherein at least one of the finite volumes overlaps with one or more parts amongst the plurality of parts and extends beyond boundaries of the one or more parts to include space between the one or more parts that is outside boundaries of the digital model, and each document space is determined based on the one or more parts on which the at least one technical document conveys information, wherein the finite volumes of different ones of at least some of the document spaces overlap;
displaying, on a display of the user interface, a three-dimensional model view rendering at least some of the plurality of parts modeling corresponding pieces of the building; and
displaying, on the display of the user interface and in response to detecting a user input with an indication to display document spaces, in the three-dimensional model view, one or more of the document spaces located at least partly within the displayed three-dimensional model view;
identifying, within the displayed three-dimensional model view, at least one first part of the plurality of parts that is not associated with any of the technical documents, the at least one first part identified by virtue of not being included in any of the one or more displayed document spaces, and
identifying, within the displayed three-dimensional model view, at least one second part of the plurality of parts that is associated with one or more of the technical documents, the at least one second part identified by virtue of being included in at least one of the one or more displayed document spaces.

14. The apparatus of claim 13, wherein the at least one memory and computer program code configured to, with the at least one processor, further cause the apparatus at least to perform:
displaying a document view rendering the information in at least one of the technical documents;
detecting, in the document view, a user input with an indication to display a location in the digital model of one or more parts amongst the plurality of parts to which the information in the at least one technical document relates;
determining, in response to said user input, at least one of the document spaces having reference to the technical document; and
displaying the at least one document space in the three-dimensional model view.

15. The apparatus of claim 13, wherein the at least one memory and computer program code configured to, with the at least one processor, further cause the apparatus at least to perform:
using, in response to user input in the three-dimensional model view selecting one or more of the displayed document spaces, references, which the one or more document spaces selected have, to obtain corresponding technical documents; and
displaying one or more document views rendering the information in the one or more technical documents obtained.

16. The apparatus of claim 13, wherein the at least one memory and computer program code configured to, with the at least one processor, further cause the apparatus at least to perform:
detecting a user input creating a new technical document;
determining, based on parts of the plurality of parts that the new technical document refers to, a finite volume and a location within the digital model for a new document space;
displaying the new document space in the three-dimensional model view; and
storing the new document space with the finite volume and the location and a reference to the new technical document to the digital model.

17. The apparatus of claim 13, wherein the at least one memory and computer program code configured to, with the at least one processor, further cause the apparatus at least to perform:
detecting a user input defining a new document space in the three-dimensional model view, wherein the defining comprises defining a finite volume and a location within the digital model of the new document space;
displaying the new document space in the three-dimensional model view;
receiving a user input to create a new technical document from the new document space;
determining parts amongst the plurality of parts within the volume;
creating the new technical document based on the parts;
storing the new technical document; and
storing to the model the new document space with the finite volume, the location and reference to the new technical document.

18. The apparatus of claim 13, wherein the at least one memory and computer program code configured to, with the at least one processor, further cause the apparatus at least to perform:
using one or more data storages at least for storing at least said digital model.

* * * * *